(12) United States Patent
Yoon et al.

(10) Patent No.: US 11,713,274 B2
(45) Date of Patent: Aug. 1, 2023

(54) MIXED SILVER POWDER AND CONDUCTIVE PASTE COMPRISING SAME

(71) Applicant: DAEJOO ELECTRONIC MATERIALS CO., LTD., Siheung-si (KR)

(72) Inventors: Chi Ho Yoon, Siheung-si (KR); Jin Ho Kwak, Siheung-si (KR); Won Jun Jo, Siheung-si (KR); Young Ho Lee, Siheung-si (KR); Jong Chan Lim, Siheung-si (KR); Moo Hyun Lim, Siheung-si (KR)

(73) Assignee: DAEJOO ELECTRONIC MATERIALS CO., LTD., Siheung-si (KR)

( * ) Notice: Subject to any disclaimer, the term of this patent is extended or adjusted under 35 U.S.C. 154(b) by 0 days.

(21) Appl. No.: 17/845,512

(22) Filed: Jun. 21, 2022

(65) Prior Publication Data
US 2022/0324748 A1    Oct. 13, 2022

Related U.S. Application Data

(62) Division of application No. 17/415,154, filed as application No. PCT/KR2020/004055 on Mar. 25, 2020, now Pat. No. 11,401,200.

(30) Foreign Application Priority Data

Mar. 29, 2019  (KR) ........................ 10-2019-0037408

(51) Int. Cl.
*H01B 1/22*    (2006.01)
*C03C 4/00*    (2006.01)
(Continued)

(52) U.S. Cl.
CPC .................. *C03C 8/18* (2013.01); *B22F 1/00* (2013.01); *B22F 1/06* (2022.01); *B22F 1/10* (2022.01);
(Continued)

(58) Field of Classification Search
CPC .... H01B 1/02; H01B 1/16; H01B 1/22; B22F 1/00; B22F 1/052; B22F 1/054; B22F 1/065; H01L 31/0224; C03C 4/14
See application file for complete search history.

(56) References Cited

U.S. PATENT DOCUMENTS 9,496,068 B2 *  11/2016  Kurihara ................. B22F 1/102
9,683,123 B2 *   6/2017  Cho ....................... C07C 251/08
(Continued)

FOREIGN PATENT DOCUMENTS

JP    2005-048237 A    2/2005
JP    2005-203304 A    7/2005
(Continued)

OTHER PUBLICATIONS

Parkhurst et al. "Thermogravimetric analysis of silver oxide mixtures", Naval Surface Weapons Center (1982) 32 pages.*
(Continued)

*Primary Examiner* — Mark Kopec
(74) *Attorney, Agent, or Firm* — Sughrue Mion, PLLC

(57) ABSTRACT

A mixed silver powder and a conductive paste comprising the powder are disclosed. The mixed silver powder is obtained by mixing two or more spherical silver powders having different properties from each other. The mixed powder may minimize the disadvantages of the respective types of the two or more powders and maximize the advantages thereof, thereby improving the characteristics of products. In addition, by comprehensively controlling the particle size distribution of surface-treated mixed silver powder
(Continued)

and the particle diameter and specific gravity of primary particles, a high-density conductor pattern, a precise line pattern, and the suppression of aggregation over time can be simultaneously achieved.

2 Claims, 6 Drawing Sheets

(51) Int. Cl.
    *C03C 8/18*     (2006.01)
    *C03C 4/14*     (2006.01)
    *C03C 8/10*     (2006.01)
    *C03C 8/16*     (2006.01)
    *H01L 31/0224*     (2006.01)
    *H01B 1/02*     (2006.01)
    *B22F 1/00*     (2022.01)
    *B22F 1/10*     (2022.01)
    *B22F 1/06*     (2022.01)

(52) U.S. Cl.
    CPC ................. *C03C 4/14* (2013.01); *C03C 8/10* (2013.01); *C03C 8/16* (2013.01); *H01B 1/02* (2013.01); *H01L 31/022425* (2013.01); *C03C 2204/00* (2013.01); *C03C 2205/00* (2013.01)

(56) References Cited

U.S. PATENT DOCUMENTS

2007/0079665 A1    4/2007    Sasaki et al.
2010/0084599 A1*    4/2010    Lewis ....................... B22F 9/24
                                                                             252/62.2
2019/0259510 A1    8/2019    Okano et al.
2021/0060655 A1    3/2021    Sasaki et al.

FOREIGN PATENT DOCUMENTS

| | | |
|---|---|---|
| JP | 2008-223096 A | 9/2008 |
| JP | 2010-070793 A | 4/2010 |
| JP | 2013-108120 A | 6/2013 |
| JP | 5505535 B1 | 5/2014 |
| JP | 2017-101268 A | 6/2017 |
| JP | 2018-080402 A | 5/2018 |
| KR | 10-2014-0053435 A | 5/2014 |
| KR | 10-2018-0040936 A | 4/2018 |
| KR | 10-2018-0100530 A | 9/2018 |

OTHER PUBLICATIONS

Liu et al. "Burnout of the organic vehicle in an electrically conductive thick-film paste", Journal of Electronic Materials, vol. 33, No. 11, 2004.*
International Search Report of PCT/KR2020/004055 dated Jul. 10, 2020 [PCT/ISA/210].
Dimitrijevic et al. "Influence of reducing agents and surfactants on size and shape of silver fine powder particles", Association of Metallurgical Engineers of Serbia, AMES, 2014 (UDC: 621.926. 085 ; 669.227).
English language machine translation of JP 2005-203304A (pub Jul. 2005).

* cited by examiner

MIXED SILVER POWDER AND CONDUCTIVE PASTE COMPRISING SAME

CROSS REFERENCE TO RELATED APPLICATIONS

This application is a Divisional Application of U.S. application Ser. No. 17/415,154, filed Jun. 17, 2021, which is a National Stage of International Application No. PCT/KR2020/004055, filed Mar. 25, 2020, claiming priority to Korean Patent Application No. 10-2019-0037408, filed Mar. 29, 2019.

TECHNICAL FIELD

The present invention relates to mixed silver powders and a conductive paste comprising the same. More specifically, the present invention aims to provide mixed silver powders capable of improving the physical properties of a conductive paste used to form electrodes for electronic products such as solar cells.

BACKGROUND ART

A conductive paste used for the formation of a circuit in electronic components such as solar cells and touch panels is generally prepared by adding silver powder and glass frit to an organic vehicle, followed by kneading them. The silver powder used for this purpose is required to have a relatively small particle size, a narrow particle size distribution, and high dispersibility for the miniaturization of electronic components, the high densification of conductor patterns, the precision of line formation, and the like. In addition, the silver powder may coagulate into flaky particles (flakes) having a size of several millimeters when kneaded with a roll mill or the like in the process of preparing a paste. Thus, it is necessary to have a viscosity to be readily kneaded and good dispersibility in a solvent.

If the particle size characteristics of silver powder are poor, the thickness of the wires or the electrodes is not uniform, and they are not uniformly sintered, so that the resistance of the conductive film increases or the strength decreases. Thus, a technique for controlling the particle size, shape, and the like of silver powder is required in order to produce silver powder having a shape close to a sphere with excellent particle size characteristics without containing coagulated particles or coarse particles. To this end, techniques are known for controlling the cumulative 10%, 50%, 90%, and 100% particle sizes (hereinafter referred to as $D_{10}$, $D_{50}$, $D_{90}$, and $D_{max}$, respectively) in the particle size distribution of silver powder and the average particle size of primary particles thereof (hereinafter referred to as $D_{SEM}$).

Further, if the dispersibility of silver powder in a paste is not good, the quality of the coating film formed therefrom and the linear shape of the line pattern deteriorates. In addition, since the fillability of the silver powder is lowered due to the voids caused by the generation of coagulated particles or coarse particles, there is a problem in conductivity. Thus, attempts have been made to solve these problems.

Japanese Laid-open Patent Publication No. 2005-48237 discloses a method of preparing a spherical silver powder having a $D_{SEM}$ of 0.6 μm or less and high dispersibility in which an alkali or a complexing agent is added to an aqueous solution containing a silver salt to prepare an aqueous solution containing a silver complex, and a polyhydric phenol such as hydroquinone is added for reduction precipitation.

Japanese Laid-open Patent Publication No. 2010-70793 discloses a fine silver powder advantageous for precise line formation in which the silver powder has a $D_{50}$ of 0.1 to 1 μm, a $D_{50}/D_{SEM}$ of 1.3 or less, and a $(D_{90}-D_{10})/D_{50}$ value of 0.8 or less.

Japanese Patent No. 5505535 discloses a silver powder having a viscosity to be readily kneaded and to suppress coagulation in which the silver powder has a ratio $(SA_B/SA_S)$ between the specific surface area $(SA_S)$ calculated from $D_{SEM}$ and the specific surface area $(SA_B)$ measured by a BET method of 0.5 to 0.9 and a $D_{50}/D_{SEM}$ value of 1.5 to 5.0.

Japanese Laid-open Patent Publication No. 2013-108120 discloses a silver powder whose particle surface is treated with a surface treatment agent in which the silver powder has a $D_{50}$ of 0.5 to 2.0 μm and a standard deviation of the particle size distribution of 0.3 to 1.0 μm.

Japanese Laid-open Patent Publication No. 2017-101268 discloses a silver powder having a surface treatment agent on its particle surface in which the silver powder has a $D_{50}$ of 0.1 to 2.0 μm, a $(D_{90}-D_{10})/D_{50}$ value of 2.0 or less, and a $D_{max}$ of 5.0 μm or less and less than 7 times of the $D_{50}$, and the average value of sphericity is 1.0 to 1.5.

Japanese Laid-open Patent Publication No. 2018-80402 discloses a dispersion liquid containing a silver powder and a solvent in which the silver powder has a $D_{SEM}$ of 0.15 to 0.5 μm and a $D_{50}/D_{SEM}$ value of 1.7 or more, and the main component of the solvent is an organic compound having 6 to 20 carbon atoms.

However, these prior art documents only disclose the particle size distribution of the silver powder. They fail to recognize the coagulation over time after the production of the silver powder and the dispersibility and sedimentation in the paste, to pay attention to the average particle diameter $(D_{SEM})$ and coagulation $(D_{50}/D_{SEM})$ of the primary particles, or to take into consideration the surface treatment of the silver powder at all. Thus, there is a limit to the densification or fine-tuning of the pattern or preventing deterioration over time.

DISCLOSURE OF INVENTION

Technical Problem

The conventional spherical silver powders have advantages and disadvantages according to their particle size distribution characteristics. For example, if the particle size is relatively small, the true specific gravity is high, which raises the sintering temperature, resulting in an increase in resistance at low-temperature sintering. On the other hand, if the particle size is relatively large, there is a disadvantage that clogging of printing occurs when screen printing is carried out in a fine pattern. In particular, the conventional silver powders need to be further improved in dispersibility when applied to pastes.

Accordingly, as a result of the research conducted by the present inventors, it has been discovered that two or more types of silver powders having different characteristics are appropriately mixed and surface treated, thereby compensating for the disadvantages of each type of the silver powders and enhancing dispersibility. In addition, it has been discovered that if the particle size distribution of the mixed silver powders, and the particle size and the specific gravity of the primary particles are comprehensively controlled and the dispersibility is increased by the combination of a surface treatment agent, it is possible to simultaneously achieve a highly densified conductor pattern, a precise line pattern, and suppression of coagulation over time.

Accordingly, an object of the present invention is to provide mixed silver powders, a conductive paste and a solar cell comprising the same, which are advantageous for the densification of a conductor pattern, precision of line formation, and suppression of coagulation over time.

Solution to Problem

Accordingly, the present invention provides mixed silver powders for solving the above problems, wherein the mixed silver powders comprise two or more types of surface treatment agents on their surfaces. Specifically, the mixed silver powders comprise two or more types of spherical silver powders having different particle size distributions, and the spherical silver powders comprise two or more types of surface treatment agents on their surfaces.

According to an embodiment, when the cumulative 10%, 50%, and 90% particle sizes by volume in the particle size distribution of the mixed silver powders obtained by laser diffraction are referred to as $D_{10}$, $D_{50}$, and $D_{90}$, respectively, and the average particle size of the primary particles obtained by image analysis of a scanning electron microscope is referred to as $D_{SEM}$, the $D_{50}$ is 0.5 to 2.5 μm, the $D_{50}/D_{SEM}$ is 1.0 to 1.5, the $(D_{90}-D_{10})/D_{50}$ is 1.0 to 2.0, and the true specific gravity is 9.4 to 10.4. According to another embodiment, the mixed silver powders have a weight increase peak at a temperature of 200° C. to 300° C. in thermogravimetric analysis (TGA) under an elevated temperature condition of 10° C./min.

According to another object of the present invention, a conductive paste comprising the mixed silver powders is provided. According to still another object of the present invention, a solar cell comprising an electrode formed from the conductive paste is provided.

Advantageous Effects of Invention

According to the present invention, two or more types of spherical silver powders having different characteristics are mixed and surface treated, whereby it is possible to enhance the dispersibility while the disadvantages of each type of the powders are minimized and the advantages thereof are maximized. In addition, according to the present invention, the particle size distribution of the mixed silver powders and the particle size and the specific gravity of the primary particles are comprehensively controlled, so that it is possible to simultaneously achieve a highly densified conductor pattern, a precise line pattern, and suppression of coagulation over time.

Accordingly, the mixed silver powders are applied to a conductive paste to increase the dispersibility and fluidity to enhance the conductivity, thereby keeping the electrode resistance low, maximizing the battery efficiency, and securing the long-term product reliability. In addition, the process for preparing the mixed silver powders is simple, and they have excellent processability when applied to a conductive paste. Thus, it is possible to enhance the production efficiency.

BEST MODE FOR CARRYING OUT THE INVENTION

Figure 1:
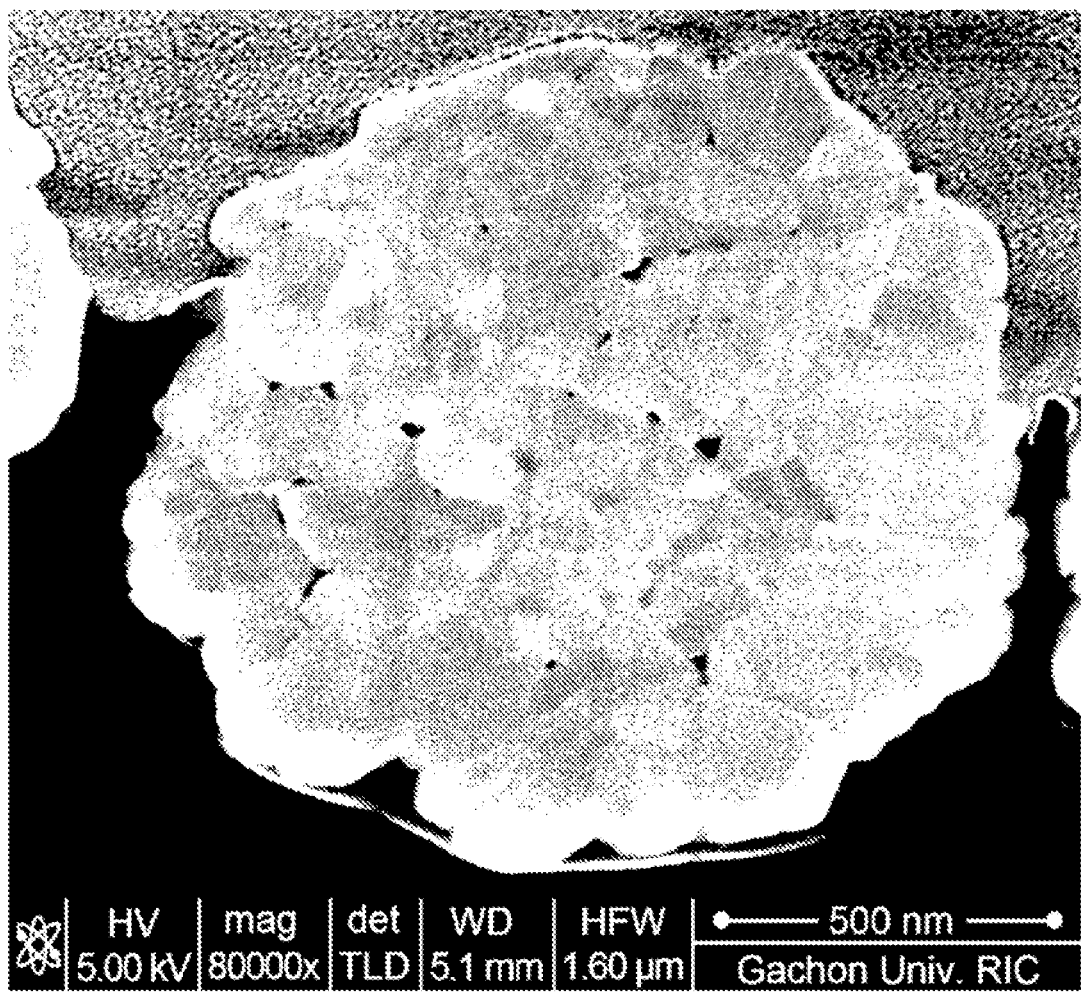
FIG. 1 is an electron microscope image of a cross-section of silver powder A3 prepared in Preparation Example 3 cut with a focused ion beam (FIB).

The present invention is not limited to what is disclosed below. Rather, it may be modified in various forms as long as the gist of the invention is not altered.

In this specification, when a part is referred to as "comprising" an element, it is to be understood that the part may comprise other elements as well, unless otherwise indicated.

In addition, all numbers and expression related to the quantities of components, reaction conditions, and the like used herein are to be understood as being modified by the term "about," unless otherwise indicated.

[Mixed Silver Powders]

The mixed silver powders of the present invention are prepared by mixing silver powders having different characters, and they comprise two or more types of surface treatment agents on their surfaces. Specifically, the mixed silver powders comprise two or more types of spherical silver powders having different particle size distributions, and the spherical silver powders comprise two or more types of surface treatment agents on their surfaces.

According to an embodiment, when the cumulative 10%, 50%, and 90% particle sizes by volume in the particle size distribution of the mixed silver powders obtained by laser diffraction are referred to as $D_{10}$, $D_{50}$, and $D_{90}$, respectively, and the average particle size of the primary particles obtained by image analysis of a scanning electron microscope is referred to as $D_{SEM}$, the $D_{50}$ is 0.5 to 2.5 μm, the $D50/D_{SEM}$ is 1.0 to 1.5, the $(D_{90}-D_{10})/D_{50}$ is 1.0 to 2.0, and the true specific gravity is 9.4 to 10.4.

According to another embodiment, the mixed silver powders also have a weight increase peak at a temperature of 200° C. to 300° C. in thermogravimetric analysis (TGA) under an elevated temperature condition of 10° C./min.

Particle Size Distribution

The particle size of the mixed silver powders may be measured by a laser diffraction particle size distribution measurement method, for example, a wet laser diffraction type particle size distribution measurement.

More specifically, 0.3 g of the mixed silver powders is added to 30 ml of isopropyl alcohol and treated with an ultrasonic washer at a power of 45 W for 5 minutes to prepare a dispersion, and then the particle size distribution of the mixed silver powders in the dispersion is measured with a particle size distribution meter (e.g., Microtrac™ MT3300EXII of Nikkiso, Analysette22 of Fritsch, and the like). The cumulative 10%, 50%, and 90% particle sizes by volume in the particle size distribution thus obtained are referred to as $D_{10}$, $D_{50}$, and $D_{90}$, respectively.

The $D_{50}$ of the mixed silver powders is 0.5 to 2.5 μm. Within the above range, a precise line can be formed, the silver powders are not excessively activated, so that they can be sintered at 400° C. or higher, and the linear shape of the line pattern may be excellent. If it is less than the above range, when a wiring layer is formed, the resistance of the conductive film increases, so that the conductivity may decrease. If it exceeds the above range, the dispersibility of the mixed silver powders is lowered, so that the particles coagulate during kneading, which deteriorates the printability. More specifically, the $D_{50}$ of the mixed silver powders may be 1.0 to 2.0 µm.

$D_{10}$, $D_{50}$, and $D_{90}$ of the mixed silver powders are particle size values measured inclusive of coagulated silver particles (i.e., secondary particles), whereas $D_{SEM}$ is an average particle size value of primary particles. Thus, as $D_{50}$ is closer to the value of $D_{SEM}$, which is an average particle size of the primary particles, the coagulation between the primary particles is less, and the particles are uniformly dispersed. In theory, $D_{50}$ cannot be less than $D_{SEM}$. Thus, if the sampling error is not considered, the lower limit of the $D_{50}/D_{SEM}$ is about 1. For example, the $D_{50}/D_{SEM}$ value may be 1.0 to 1.5, 1.0 to 1.3, 1.0 to 1.2, or 1.0 to 1.1. Within the above range, the dispersibility is improved, which is more advantageous for the formation of precise lines.

In addition, the $(D_{90}-D_{10})/D_{50}$ value of the mixed silver powders may be 1.0 to 2.0 or 1.0 to 1.7. Within the above range, the mixed silver powders have a narrow particle size distribution, and it is easier to achieve the densification of patterns, so that the linear shape of the line pattern may be excellent.

In addition, the $D_{10}/D_{50}$ value of the mixed silver powders may be 0.5 or less, for example, 0.1 to 0.5. Within the above range, the silver particles having a relatively small particle size are filled between the silver particles having an average particle diameter, so that the concentration of silver in the conductive paste can be further enhanced.

Specific Gravity/Density

The mixed silver powders may have a true specific gravity of 9.4 to 10.4, more specifically, 9.8 to 10.2. The true specific gravity may be measured using a true specific gravity measuring device commonly used in the art. For example, it may be measured using AccupycII of Micromeritics.

The mixed silver powders may have a tap density of 2.0 to 7.5 g/cc. Within the above range, the fillability of the silver powders in the coating film is excellent, the resistance of the conductive film can be kept low, and it is more advantageous in terms of forming a highly densified pattern. If the tap density is less than the above range, the filling rate may be lowered, so that the resistance of the conductive film may be excessively high. If it exceeds the above range, the dispersibility of the silver powders is lowered, so that the particles coagulate during kneading, which deteriorates the printability. More specifically, the tap density of the mixed silver powders may be 3.5 to 6.0 g/cc, 4.0 to 5.8 g/cc, 4.2 to 5.55 g/cc, 4.2 to 5.2 g/cc, or 4.3 to 5.1 g/cc.

The tap density may be measured, for example, by charging 20 g of the mixed silver powders to a 20-ml mass cylinder made of tempered glass and measuring the bulk density of the mixed silver powders using a shake specific gravity meter (KRS-409, Kuramochi Scientific Instruments Manufacturing Co., Ltd.) under the conditions of a shaking width of 2 cm and a tap count of 500 times. As another example, the tap density may be measured by charging 15 g of the mixed silver powders to a 20-ml test tube using Autotap of Quantachrome, repeating 2,000 times with a 20 mm drop, and measuring the volume.

As an example, the mixed silver powders may have a specific surface area of 0.1 to 2.0 m²/g and a tap density of 2.0 to 7.5 g/cc.

Specific Surface Area/Sphericity

The mixed silver powders may have a specific surface area (BET) of 0.1 to 2.0 m²/g. Within the above range, since the size and viscosity of the silver powders are appropriate, it is not necessary to dilute them when applied to a paste, and since the concentration of silver in the paste can be kept high, it is possible to prevent disconnection of the wires. If it is less than the above range, the silver powders coagulate to produce coagulated silver particles during kneading, which deteriorates the printability. If it exceeds the above range, the resistance of the conductive film may be high. More specifically, the specific surface area (BET) of the mixed silver powders may be 0.2 to 0.7 m²/g or 0.3 to 0.6 m²/g.

The specific surface area may be measured by the BET method by nitrogen adsorption. For example, a specific surface area measuring device (Macsorb HIM (model 1210) of MOUNTECH, Belsorp-miniII of MicrotracBEL, or the like) generally used in the art may be used. The degassing conditions for measuring the specific surface area may be 10 minutes at 60° C.

The mixed silver powders may have an average sphericity of 1.5 or less, for example, 1.1 to 1.5. Within the above range, the particle filling rate may be maintained at a high level even if the spherical shape of the silver particles is somewhat deformed.

In addition, the mixed silver powders may have a maximum sphericity of 2.0 or less, for example, 1.1 to 2.0. Within the above range, a dense coating film with a line pattern in an excellent shape is formed without disconnection of the wires, resulting in an excellent current efficiency.

Since the mixed silver powders are composed of spherical particles as described above, they are well applied to photolithography, offset, dipping, and printing methods.

Silver Powders A and B

The mixed silver powders according to the present invention comprise two or more types of spherical silver powders having different particle size distributions. For example, the mixed silver powders according to the present invention may be a mixture of 2 to 5 types of spherical silver powders having different particle size distributions.

For example, the mixed silver powders may comprise silver powder A; and silver powder B having a particle size distribution different from that of the silver powder A. In such event, the silver powder A may have a $D_{50}$ of 0.5 to 2.5 µm, a $D_{50}/D_{SEM}$ of 1.0 to 1.2, and a $(D_{90}-D_{10})/D_{50}$ of 0.9 to 1.2. In addition, the silver powder B may have a $D_{50}$ of 0.7 to 3.5 µm, a $D_{50}/D_{SEM}$ of 1.0 to 1.5, and a $(D_{90}-D_{10})/D_{50}$ of 1.0 to 2.0.

In addition, the two or more types of silver powders having different particle size distributions may have different true specific gravities. For example, the mixed silver powders may be a mixture of spherical silver powder A having a true specific gravity of 10.0 to 10.4 and spherical silver powder B having a true specific gravity of 9.3 to 10.0.

Specifically, the mixed silver powders may comprise silver powder A; and silver powder B having a particle size distribution different from that of the silver powder A, wherein the silver powder A may have a $D_{50}$ of 0.5 to 2.5 µm, a $D_{50}/D_{SEM}$ of 1.0 to 1.2, a $(D_{90}-D_{10})/D_{50}$ of 0.9 to 1.2, and a true specific gravity of 10.0 to 10.4, and the silver powder B may have a $D_{50}$ of 0.7 to 3.5 µm, a $D_{50}/D_{SEM}$ of 1.0 to 1.5, a $(D_{90}-D_{10})/D_{50}$ of 1.0 to 2.0, and a true specific gravity of 9.3 to 10.0.

When two types of powders having different properties are mixed as described above, the characteristics of the product can be improved by minimizing the disadvantages of each powder and maximizing the advantages thereof. For example, if the silver particle A is used alone, the true specific gravity is high, which raises the sintering temperature, resulting in an increase in resistance at low-temperature sintering. In addition, if the silver particle B is used alone, the $(D_{90}-D_{10})/D_{50}$ is larger than that of the silver powder A, so that there may be a problem that clogging of printing occurs when screen printing is carried out in a fine pattern. However, if these two types of silver powders are mixed, the disadvantages can be compensated to enhance the product characteristics. In particular, this effect can be maximized by adjusting the mixing ratio.

Figure 2:
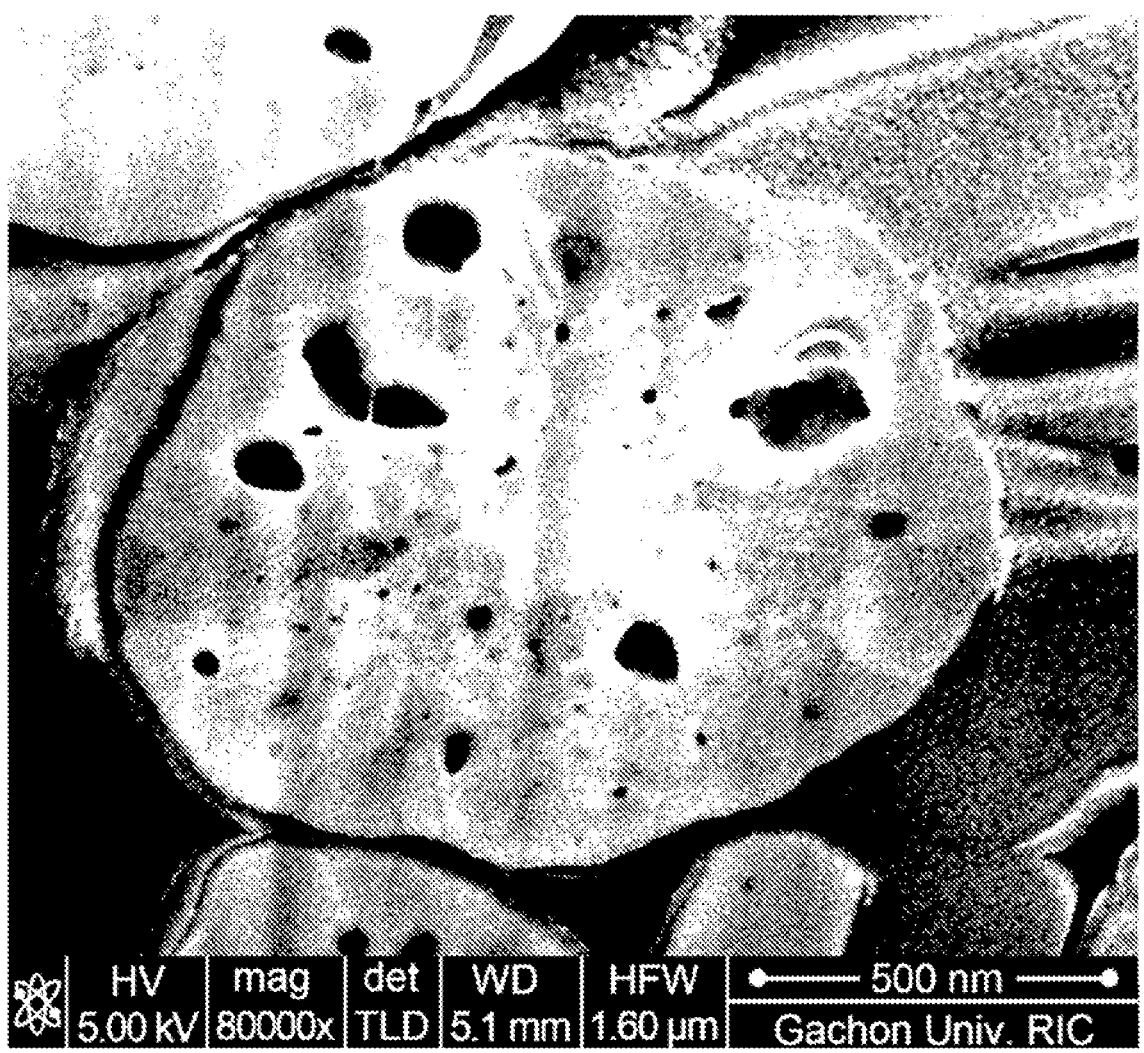
FIG. 2 is an electron microscope image of a cross-section of silver powder B2 prepared in Preparation Example 5 cut with an FIB.

Since the silver powder A has a higher true specific gravity than that of the silver powder B, the number or size of closed pores present therein may be small (see FIGS. 1 and 2). For example, the silver powder A may have a porosity of 0.1 to 3%, and the silver powder B may have a porosity of 5 to 20%. The porosity may be calculated as a percentage of the pore area to the particle area in a cross-sectional image of silver powder (see FIG. 3).

The mixed silver powders may comprise the silver powder A and the silver powder B in a weight ratio of 90:10 to 10:90. Alternatively, the mixed silver powders may comprise the silver powder A and the silver powder B in a weight ratio of 80:20 to 50:50. Within the above range, the sinterability is increased to further reduce the resistance, and the dispersibility is improved, so that it is possible to further suppress disconnection even in continuous printing.

Surface Treatment Agent

The mixed silver powders comprise two or more types of surface treatment agents on the surfaces of the spherical silver powders.

That is, the individual spherical silver particles constituting the mixed silver powders comprise two or more types of surface treatment agents on the surfaces thereof.

The content of the surface treatment agents may be 3.0% by weight or less, 1.0% by weight or less, or 0.05 to 1.0% by weight, or 0.05 to 0.5% by weight, based on the weight of the silver particles. Within the above range, it is possible to further enhance the dispersibility when a paste is prepared and to adjust the rheology of the paste to enhance the printability. In addition, it is possible to further reduce the carbon remaining upon sintering the printed paste.

Examples of such surface treatment agents include fatty acids, surfactants, organometallic compounds, chelating agents, and polymer dispersants. Salts or derivatives thereof can also be used.

Fatty acids among the above have at least one carboxyl group in the chain-type hydrocarbon backbone, so that the adsorption and desorption characteristics of silver powders can be appropriately adjusted. Thus, the surface treatment agent may be a fatty acid, a derivative thereof, or a salt thereof.

The carbon number of the fatty acid may be 12 to 20, more specifically 16 to 18. If the carbon number of the fatty acid is within the above range, the dispersibility can be further enhanced without coagulation by virtue of steric hindrance, and it is more advantageous from the viewpoint of conductivity since it is easily decomposed by sintering.

Specific examples of the fatty acid include palmitic acid, aleuritic acid, ricinoleic acid, oleic acid, and stearic acid.

Specifically, the surface treatment agent may comprise two or more types selected from the group consisting of a C16 fatty acid having 16 carbon atoms, a C18 fatty acid having 18 carbon atoms, a derivative thereof, and a salt thereof.

More specifically, the surface treatment agent may comprise the C16 fatty acid and the C18 fatty acid at a weight ratio of 20:80 to 80:20. Within the above range, it is more advantageous from the viewpoint of dispersibility.

In addition, it is preferable from the viewpoint of hydrophilicity that the fatty acid contains at least one hydroxyl group in the molecule. For example, fatty acids in which one hydrogen is substituted with a hydroxyl group, such as ricinoleic acid and 12-hydroxystearic acid, are advantageous from the viewpoint of hydrophilicity. If a plurality of hydrogens are substituted with a hydroxyl group as in aleuritic acid, it may also be advantageous from the viewpoint of thixotropy.

These fatty acids may be used alone or in combination of two or more.

A Fourier transform infrared spectrometer (FT-IR), an automatic carbon analyzer, and a gas chromatography mass spectrometer (GC-MS) can be used to analyze the fatty acids attached to the surfaces of the mixed silver powders. In such event, the surface treatment agent may be detached by heating the surfaces of the mixed silver powders with a thermal decomposer or the like or extracted with a solvent to be analyzed. Meanwhile, since fatty acids having a hydroxyl group, such as ricinoleic acid, have high polarity, the sensitivity is too low to be measured by the above method. Thus, the functional group thereof may be methylated to be analyzed.

As a specific example, 1 ml of a mixed solution of hydrochloric acid and methanol (a hydrochloric acid-methanol reagent from Tokyo Chemical Industry Co., Ltd.) is added to 0.5 g of the mixed silver powders, which is heated at 50° C. for 30 minutes to detach the organic substances from the surfaces of the mixed silver powders and to methylate the functional groups. After it is cooled, 1 ml of pure water and 2 ml of n-hexane are added thereto and stirred to extract the methylated organic substances into hexane. The substances in hexane are analyzed using a gas chromatography mass spectrometer (GC-MS) to analyze the fatty acids on the surfaces of the mixed silver powders.

Thermal Characteristics

The thermal characteristics of the mixed silver powders according to the present invention may be confirmed in a process in which organic substances (i.e., surface treatment agents) are detached from the surfaces of the silver powders under an elevated temperature condition by thermogravimetric analysis (TGA), differential scanning calorimetry (DSC), and the like.

When the mixed silver powders are heated under an elevated temperature condition, volatile components such as moisture present on the surfaces are separated, so that the weight is gradually reduced. When a certain temperature is reached, the surface treatment agent is separated, and surface oxidation of the silver powders proceeds to increase the weight. In addition, as the separated surface treatment agent burns, an exothermic peak is generated, and sintering of the silver powders may occur at the same time.

Specifically, the mixed silver powders have a weight increase peak at a temperature of 200° C. to 300° C. in thermogravimetric analysis (TGA) under an elevated temperature condition of 10° C./min. More specifically, the mixed silver powders have a weight increase peak at a temperature of 225° C. to 250° C. in thermogravimetric analysis (TGA) under an elevated temperature condition of 10° C./min. In such event, the extent of increase in weight may be 0.01 to 2.0% by weight based on the initial weight.

In addition, the mixed silver powders may have an exothermic peak in the temperature range of 200° C. to 300° C., or 200° C. to 250° C., in differential scanning calorimetry (DSC) under an elevated temperature condition of 10° C./min. More specifically, the mixed silver powders may have an exothermic peak in the temperature range of 225° C. to 250° C. in differential scanning calorimetry (DSC) under an elevated temperature condition of 10° C./min.

The extent of increase in weight and the temperature and size of the exothermic peak may vary with the type of the reducing agent and the type and amount of the surface treatment agent used in the preparation of the mixed silver powders. The mixed silver powders of the present invention have an exothermic peak at a low temperature, so that sintering can take place quickly even at low temperatures. When they are applied to a conductive paste for a front electrode of a solar cell, the sintering characteristics are enhanced, so that the photovoltaic conversion efficiency of the solar cell can be increased.

[Process for Preparing Mixed Silver Powders]

The mixed silver powders according to the present invention may be prepared by a process, which comprises the preparation of a silver ion dispersion liquid, reduction precipitation, recovery, drying, washing, pulverization, classification, mixing, and surface treatment.

Hereinafter, each step of the preparation process will be described in detail.

Preparation of a Dispersion Liquid of Silver Ions

First, a dispersion liquid of silver ions for producing silver particles that constitute the silver powder is prepared. For example, as an aqueous dispersion liquid containing silver ions, an aqueous solution or slurry that contains silver nitrate, a silver complex, or a silver intermediate may be used.

The aqueous solution that contains a silver complex among the above may be prepared by adding ammonia water or an ammonium salt to an aqueous silver nitrate solution or a silver oxide suspension. Specifically, if an aqueous solution of a silver ammine complex obtained by adding ammonia water to an aqueous silver nitrate solution is used, it may be more advantageous for preparing silver powder having an appropriate particle diameter and spherical shape.

Since the coordination number of ammonia in the silver ammine complex is 2, it is possible to add 2 moles or more of ammonia per mole of silver. In consideration of the reactivity, 8 moles or less of ammonia per mole of silver may be added. However, if the content of the reducing agent in the subsequent reduction step is increased, it may have no impact on obtaining an appropriate particle size and spherical silver powder even if the amount of ammonia added exceeds 8 moles.

In addition, a pH adjusting agent may be further added to the aqueous dispersion containing silver ions. The conventional acids or bases such as nitric acid and sodium hydroxide may be used as the pH adjusting agent.

Reduction Precipitation

A reducing agent is added to the dispersion liquid of silver ions to reduce the silver ions, thereby precipitating silver powder.

Examples of the reducing agent include ascorbic acid, sulfite, alkanolamine, hydrogen peroxide, formic acid, ammonium formate, sodium formate, glyoxal, tartaric acid, sodium hypophosphite, sodium borohydride, hydroquinone, hydrazine, pyrogallol, glucose, gallic acid, formalin, sodium sulfite anhydride, and sodium sulfoxylate (rongalite). Specifically, it may be more advantageous for controlling the particle size of the silver powder to use one or more selected from the group consisting of formalin, hydrazine, and sodium borohydride as the reducing agent.

The reducing agent is preferably used in an amount of 1 equivalent or more relative to silver from the viewpoint of the yield of the silver powder to be precipitated. If a reducing agent having a relatively low reducing power is used, it is preferable to increase the amount of the reducing agent to be used. For example, the reducing agent may be used in an amount of 2 equivalents or more, 2 to 20 equivalents, 5 to 20 equivalents, or 10 to 20 equivalents, relative to silver.

Recovery

Thereafter, the silver powder thus precipitated by reduction is recovered.

The recovery may be carried out by a conventional process (e.g., decantation or the like) used in the art, and it is not particularly limited.

In addition, it is preferable to wash the silver powder obtained by reduction as described above since they contain impurities. The recovery and washing may be carried out separately or simultaneously, and they may be repeated several times.

For the washing, pure water or the like may be used. An electrical conductivity of water after washing may be measured to determine the point of termination.

Drying

A cake containing a lot of moisture is obtained through the recovery and washing, so that it is necessary to remove the moisture to be used as silver powder.

Thus, the silver powder recovered and washed is dried.

The drying may be carried out using reduced pressures to vacuum, warm air, dry wind, volatile solvents, compressed air, centrifugal force, or the like. Specifically, it may be carried out using warm air under reduced pressures. In addition, the drying may be carried out at a temperature of about 100° C. or lower at which the silver powder is not sintered.

Pulverization

If physical force is applied to the aggregates of silver powders in the drying step to remove moisture, the silver powder does not agglomerate together or harden, so that a pulverization step is not necessary. However, if no physical force is applied as in vacuum drying, the aggregates of silver powder from which moisture has been removed may coagulate in the form of a lump.

Thus, the aggregates of dried silver powder are preferably pulverized. The drying and pulverization may be simultaneously carried out. In addition, the pulverization step is also necessary to increase the efficiency of the subsequent classification step.

The method for pulverization is not particularly limited as long as it can pulverize the aggregates of silver powder. For example, a high-speed stirring may be used.

Classification

The silver powder thus pulverized may be classified using a classifier or the like.

In such event, if a surface treatment agent such as a dispersant is present on the surface of the silver powder, the surface is activated thereby, and they are prone to adhere to the inner wall of the classifier. In the conventional method in which the classifier itself rotates for classification, the shape of the silver particle may be altered by collision or coalescence of the silver particles onto the inner wall of the classifier or by collision or coalescence of the silver particles with each other. Thus, even if spherical silver particles are obtained in the recovery step, it may be difficult to obtain spherical silver powder upon the classification step since the silver particles may be distorted. Accordingly, in order to prevent this, it is desirable to use a method in which the classifier itself does not rotate. For example, if the silver powder is classified by generating a swirling flow (i.e., free vortex) by air in the classifier, the silver particles can more advantageously maintain their spherical shape.

Mixing

Thereafter, two or more types of the spherical silver powders thus prepared are mixed. Specifically, two or more types of spherical silver powders having different particle size distributions are mixed.

The mixing may be carried out using an apparatus capable of physically carrying out a mixing step. Examples of such mixing apparatus include a planetary mixer, a concrete mixer, a tumbler mixer, a Henschel mixer, and an intensive mixer. Other apparatuses capable of mixing two or more types of materials than the above are not particularly limited.

Surface Treatment

A surface treatment agent is added to the mixed silver powders, so that the surface treatment agent is adsorbed on the surfaces of the silver particles.

The type and amount of the surface treatment agent used for this purpose are as described above.

In addition, a surface treatment agent may be further added in the previous mixing step to be adsorbed simultaneously with the mixing of the silver powders.

In addition, in order to have a solid surface treating agent adsorbed, it is advantageously liquefied to treat all the particles homogeneously. Thus, it is desirable to dissolve the surface treatment agent in a low-boiling point organic solvent or to coat it at a temperature higher than the melting point of the surface treatment agent.

Examples of the apparatus that can be used to have the surface treatment agent absorbed include a planetary mixer, a Henschel mixer, and an intensive mixer. It may be used with a device capable of controlling the temperature and an apparatus capable of continuously mixing the powders.

In addition, well-known steps may be appropriately adopted besides the characteristic steps described above. As a result, mixed silver powders can be finally obtained.

[Conductive Paste and Solar Cell]

The present invention provides a conductive paste comprising the mixed silver powders.

Further, the present invention provides a solar cell comprising an electrode formed from the conductive paste.

The conductive paste may comprise 80 to 95% by weight or 85 to 92% by weight of the mixed silver powders; 0.1 to 10% by weight, 0.5 to 3.0% by weight, or 1.0 to 2.5% by weight of glass frit; and 4.5 to 19.5% by weight or 5.0 to 14.0% by weight of an organic vehicle. As a specific example, the conductive paste may comprise 80 to 95% by weight of the mixed silver powders; 0.5 to 3.0% by weight of glass frit; and 4.5 to 19.5% by weight of an organic vehicle.

Mixed Silver Powders

The mixed silver powders contained in the conductive paste may be the mixed silver powders as described above. The mixed silver powders are excellent in particle size characteristics and dispersibility, so that the thickness of the wires or the electrodes is uniform and that they are readily sintered. Thus, the resistance of the conductive film can be maintained to be low.

Glass Frit

The glass frit is a component for adhering the silver powders to the substrate upon sintering. It may be appropriately selected and used according to the purpose.

Examples of the glass frit include bismuth silicates, alkali metal borosilicates, alkali earth metal borosilicates, zinc borosilicates, lead borates, lead borosilicates, lead silicates, and lead telluriums, which may be used alone or in combination of two or more. It is desirable not to contain lead from the environmental viewpoint.

The glass frit may have a softening point of 400° C. to 600° C. Within the above range, it is advantageous for obtaining a dense conductive film having sufficient adhesive strength by virtue of no residual carbon and easy sintering. However, if the softening point is lower than the above range, the removal of the binder may be difficult because the sintering of the glass frit starts before the resin component in the paste evaporates. As a result, carbon may remain upon sintering, and such defects as peeling of the conductive film may occur. In addition, if the softening point is higher than the above range, it may be difficult to obtain a dense conductive film having sufficient adhesive strength.

The softening point can be calculated, for example, from the starting point of the second endothermic peak in the DTA curve obtained using a thermogravimetric analyzer.

Organic Vehicle

The organic vehicle may comprise an organic solvent, a binder resin, and an additive.

The organic solvent is not particularly limited. For example, terpineol, butyl carbitol, butyl carbitol acetate, 2,2,4-trimethyl-1,3-pentanediol isobutyrate (Texanol™) or the like may be used alone or in combination of two or more.

A cellulose resin, an epoxy resin, an acrylic resin, a polyester resin, a polyimide resin, a polyurethane resin, a phenoxy resin, a silicone resin, or the like may be used alone or in combination of two or more as the binder resin.

Specifically, a cellulose-based resin such as ethyl hydroxyethyl cellulose (EHEC) and ethyl cellulose (EC) may be used as the binder resin.

Since ethyl hydroxyethyl cellulose among the above has good compatibility with an organic solvent, it is easily dissolved in an organic solvent and can reduce the rate of change in viscosity of a conductive paste over time. However, ethyl hydroxyethyl cellulose is not good in compatibility with some linear chain glycol ester organic solvents (e.g., alkylene glycol diacetate, alkylene glycol dipropionate, and the like). In such event, one or more organic solvents having a cyclic skeleton (e.g., cyclohexyl propionate, 2-cyclohexyl-4-methyl-1,3-dioxane, dihydroterfinyl acetate, isobornyl acetate, and the like) may be mixed to improve the compatibility.

Meanwhile, since ethyl cellulose has low solubility in organic solvents and the change in viscosity upon the preparation of a paste is large, it is desirable to use it in combination with ethyl hydroxyethyl cellulose. If the binder resin comprises ethyl hydroxyethyl cellulose and ethyl cellulose together, it is preferable from the viewpoint of the rate of change in viscosity over time that the weight ratio of ethyl hydroxyethyl cellulose to ethyl cellulose (i.e., EHEC/EC) is 1 or more.

In addition, if ethyl hydroxyethyl cellulose is used as the binder resin, the content of the ethoxy group in ethyl hydroxyethyl cellulose is more than 56% by weight, which is advantageous for preventing high viscosity and solubility reduction by virtue of sufficient compatibility with an organic solvent. The content of an ethoxy group may be measured, for example, by a gas chromatography method as provided in ASTM $D_{4794}$-94. In this method, the hydroxyethoxy group ($-OC_2H_4OH$) and the ethoxy group ($-OC_2H_5$) substituted to cellulose are measured without distinction from each other. Thus, the term "content of an ethoxy group" in this specification may refer to the total content (% by weight) of the hydroxyethoxy group and the ethoxy group in ethyl hydroxyethyl cellulose.

The content of the binder resin may be 0.4 to 3.0% by weight based on the total weight of the conductive paste. Within the above content range, the strength and adhesion of the coating film are enhanced, whereby the binder may be readily removed.

In addition, the organic vehicle may further comprise an additive. For example, it may comprise a plasticizer, a metal oxide, a dispersant, a viscosity modifier, or the like.

Examples of the plasticizer include rosin ester, polyvinyl butyral, alkyl phthalate, and the like.

Specifically, the organic vehicle comprises a binder resin, an additive, and an organic solvent. It may comprise them in an amount of 0.4 to 3.0% by weight, 0.1 to 3.0% by weight, and 4.0 to 18.5% by weight, respectively, based on the total weight of the conductive paste.

Properties of the Paste

It is preferable that the conductive paste has an appropriate viscosity. If the viscosity is too low, the flowability increases and the electrode width becomes wide, which may lower the photovoltaic conversion efficiency. On the other hand, if the viscosity is too high, the continuous printability is deteriorated during printing due to clogging of the screen, and it is difficult to obtain a uniform electrode pattern due to disconnection and step difference, which may increase the electrode resistance.

In addition, it is preferable that the paste has a ratio of the viscosity under low-speed agitation conditions (e.g., 10 rpm) to the viscosity under high-speed agitation conditions (e.g., 100 rpm) in a suitable range (e.g., 3 to 6). If the ratio of viscosities is too low, a disconnection may occur due to a problem in continuous printability. On the other hand, if the ratio of viscosities is too high, there is no problem in continuous printability, but steps may be formed.

According to the present invention, two or more types of spherical silver powders having different characteristics are mixed, whereby it is possible to improve the characteristics of the product while the disadvantages of each type of powders are minimized and the advantages thereof are maximized. In addition, according to the present invention, the particle size distribution of the mixed silver powders and the particle size and the specific gravity of the primary particles are comprehensively controlled, so that it is possible to simultaneously achieve a highly densified conductor pattern, a precise line pattern, and suppression of coagulation over time.

Accordingly, the mixed silver powders are applied to a conductive paste to increase the dispersibility and fluidity to enhance the conductivity, thereby keeping the electrode resistance low, maximizing the battery efficiency, and securing the long-term product reliability. In addition, the process for preparing the mixed silver powders is simple, and they have excellent processability when applied to a conductive paste. Thus, it is possible to enhance the production efficiency.

Mode for the Invention

The present invention will be described in more detail with reference to the following examples. However, these examples are provided to illustrate the present invention, and the scope of the examples is not limited thereto only.

Preparation Example 1: Silver Powder A1

25 kg of an aqueous ammonia solution of 25% by weight was added to 53 kg of an aqueous silver nitrate solution containing 16 kg of silver to prepare an aqueous silver solution. 0.3 kg of sodium alginate was dissolved in 66 kg of water, followed by adjusting the pH to 10.5 with ammonia and mixing 16 kg of hydrazine hydrate, to obtain an aqueous reducing agent solution. The temperature of the aqueous reducing agent solution was maintained at 25° C. using a thermostat, and the aqueous silver solution was uniformly added thereto over 6 hours to precipitate silver. The precipitated silver was washed, filtered, dried, pulverized using a jet mill, and classified to obtain spherical silver powder A1. The silver powder A1 had a $D_{50}$ of 1.15 μm, a $D_{50}/D_{SEM}$ of 1.01, a $(D_{90}-D_{10})/D_{50}$ of 0.99, and a true specific gravity of 10.28.

Preparation Example 2: Silver Powder A2

The procedure of Preparation Example 1 was repeated except that the addition of the aqueous silver solution was carried out over 10 hours to obtain spherical silver powder A2. The silver powder A2 had a $D_{50}$ of 1.58 μm, a $D_{50}/D_{SEM}$ of 1.01, a $(D_{90}-D_{10})/D_{50}$ of 0.99, and a true specific gravity of 10.31.

Preparation Example 3: Silver Powder A3

The procedure of Preparation Example 1 was repeated except that the addition of the aqueous silver solution was carried out over 12 hours to obtain spherical silver powder A3. The silver powder A3 had a $D_{50}$ of 1.83 μm, a $D_{50}/D_{SEM}$ of 1.02, a $(D_{90}-D_{10})/D_{50}$ of 1.04, and a true specific gravity of 10.31.

Preparation Example 4: Silver Powder B1

510 kg of an aqueous silver nitrate solution containing 16 kg of silver was heated to 65° C. Added thereto was 56 kg of an aqueous ammonia solution of 28% by weight to prepare a silver-ammonia complex solution. An aqueous solution obtained by diluting 53 kg of an aqueous solution of formaldehyde (formalin) of 37% by weight in 135 kg of water was added to the silver-ammonia complex solution over 10 seconds to obtain a silver slurry. The silver slurry was washed with water and ethanol, filtered, dried, pulverized using a jet mill, and classified to obtain spherical silver powder B1. The silver powder B1 had a $D_{50}$ of 1.97 μm, a $D_{50}/D_{SEM}$ of 1.46, a $(D_{90}-D_{10})/D_{50}$ of 1.30, and a true specific gravity of 9.68.

Preparation Example 5: Silver Powder B2

The procedure of Preparation Example 4 was repeated except that 510 kg of an aqueous silver nitrate solution containing 16 kg of silver was heated to 45° C. and that 48 kg of an aqueous ammonia solution of 28% by weight was added thereto to obtain spherical silver powder B2. The silver powder B2 had a $D_{50}$ of 1.76 μm, a $D_{50}/D_{SEM}$ of 1.43, a $(D_{90}-D_{10})/D_{50}$ of 1.37, and a true specific gravity of 9.53.

Example 1: Preparation of Silver Powder C1

16 kg of silver powder A1 and 4.0 kg of silver powder B1 were put into an intensive mixer, and 21 g of stearic acid (C18) and 9 g of palmitic acid (C16) were added for surface treatment. The temperature was maintained at 70° C. using a thermostat, and stirring was performed at 1,500 rpm for 180 minutes to obtain silver powder C1.

Example 2: Preparation of Silver Powder C2

10 kg of silver powder A2 and 10 kg of silver powder B2 were put into an intensive mixer, and 18 g of stearic acid (C18) and 42 g of palmitic acid (C16) were added for surface treatment. The temperature was maintained at 70° C. using a thermostat, and stirring was performed at 1,500 rpm for 180 minutes to obtain silver powder C2.

Example 3: Preparation of Silver Powder C3

13.2 kg of silver powder A3 and 6.8 kg of silver powder B2 were put into an intensive mixer, and 50 g of stearic acid (C18) and 50 g of palmitic acid (C16) were added for surface treatment. The temperature was maintained at 70° C. using a thermostat, and stirring was performed at 1,500 rpm for 180 minutes to obtain silver powder C3.

Example 4: Preparation of Silver Powder C4

16 kg of silver powder A2 and 4.0 kg of silver powder B1 were put into an intensive mixer, and 15 g of stearic acid (C18) and 15 g of palmitic acid (C16) were added for surface treatment. The temperature was maintained at 70° C. using a thermostat, and stirring was performed at 1,500 rpm for 180 minutes to obtain silver powder C4.

Example 5: Preparation of Silver Powder C5

10.0 kg of silver powder A1 and 10.0 kg of silver powder B1 were put into an intensive mixer, and 42 g of stearic acid (C18) and 18 g of palmitic acid (C16) were added for surface treatment. The temperature was maintained at 70° C. using a thermostat, and stirring was performed at 1,500 rpm for 180 minutes to obtain silver powder C5.

Example 6: Preparation of Silver Powder C6

13.2 kg of silver powder A2 and 6.8 kg of silver powder B2 were put into an intensive mixer, and 70 g of stearic acid (C18) and 30 g of palmitic acid (C16) were added for surface treatment. The temperature was maintained at 70° C. using a thermostat, and stirring was performed at 1,500 rpm for 180 minutes to obtain silver powder C6.

Comparative Example 1: Preparation of Silver Powder D 16.0 kg of silver powder A2 was put into an intensive mixer, and 16.8 g of stearic acid (C18) and 7.2 g of palmitic acid (C16) were added for surface treatment. The temperature was maintained at 70° C. using a thermostat, and stirring was performed at 1,450 rpm for 180 minutes to obtain silver powder D.

Comparative Example 2: Preparation of Silver Powder E 16.0 kg of silver powder B1 was put into an intensive mixer, and 7.2 g of stearic acid (C18) and 16.8 g of palmitic acid (C16) were added for surface treatment. The temperature was maintained at 70° C. using a thermostat, and stirring was performed at 1,450 rpm for 180 minutes to obtain silver powder E.

Comparative Example 3: Preparation of Silver Powder F 10.0 kg of silver powder A1 and 10.0 kg of silver powder B1 were put into an intensive mixer, the temperature was maintained at 70° C. using a thermostat, and stirring was performed at 1,500 rpm for 120 minutes to obtain silver powder F.

Comparative Example 4: Preparation of Silver Powder G 16.0 kg of silver powder A1 and 4.0 kg of silver powder B1 were put into an intensive mixer, and 60 g of palmitic acid (C16) was added for surface treatment. The temperature was maintained at 65° C. using a thermostat, and stirring was performed at 1,500 rpm for 180 minutes to obtain silver powder G.

Comparative Example 5: Preparation of Silver Powder H 16.0 kg of silver powder A2 and 4.0 kg of silver powder B1 were put into an intensive mixer, and 60 g of stearic acid (C18) was added for surface treatment. The temperature was maintained at 75° C. using a thermostat, and stirring was performed at 1,500 rpm for 180 minutes to obtain silver powder H.

The compositions of the silver powders prepared in the above Examples and Comparative Examples are summarized in Tables 1 and 2 below.

Test Example 1: Analysis of Silver Powder

The silver powder was measured for the particle size distribution by laser diffraction using Analysette22 of Fritsch. The silver powder was degassed at 100° C. for 60 minutes and measured for the specific surface area (BET) using Belsorp-miniII of MicrotracBEL. 30 g of the silver powder placed in a 10-ml container and measured for the true specific gravity using Accupyc II of Micromeritics. 15 g of the silver powder was placed in a 20-ml test tube and subjected to 2,000 taps with a 20 mm drop using Autotap of Quantachrome for the measurement of the tap density (TD).

The results are shown in Tables 1 and 2 below.

Figure 3:
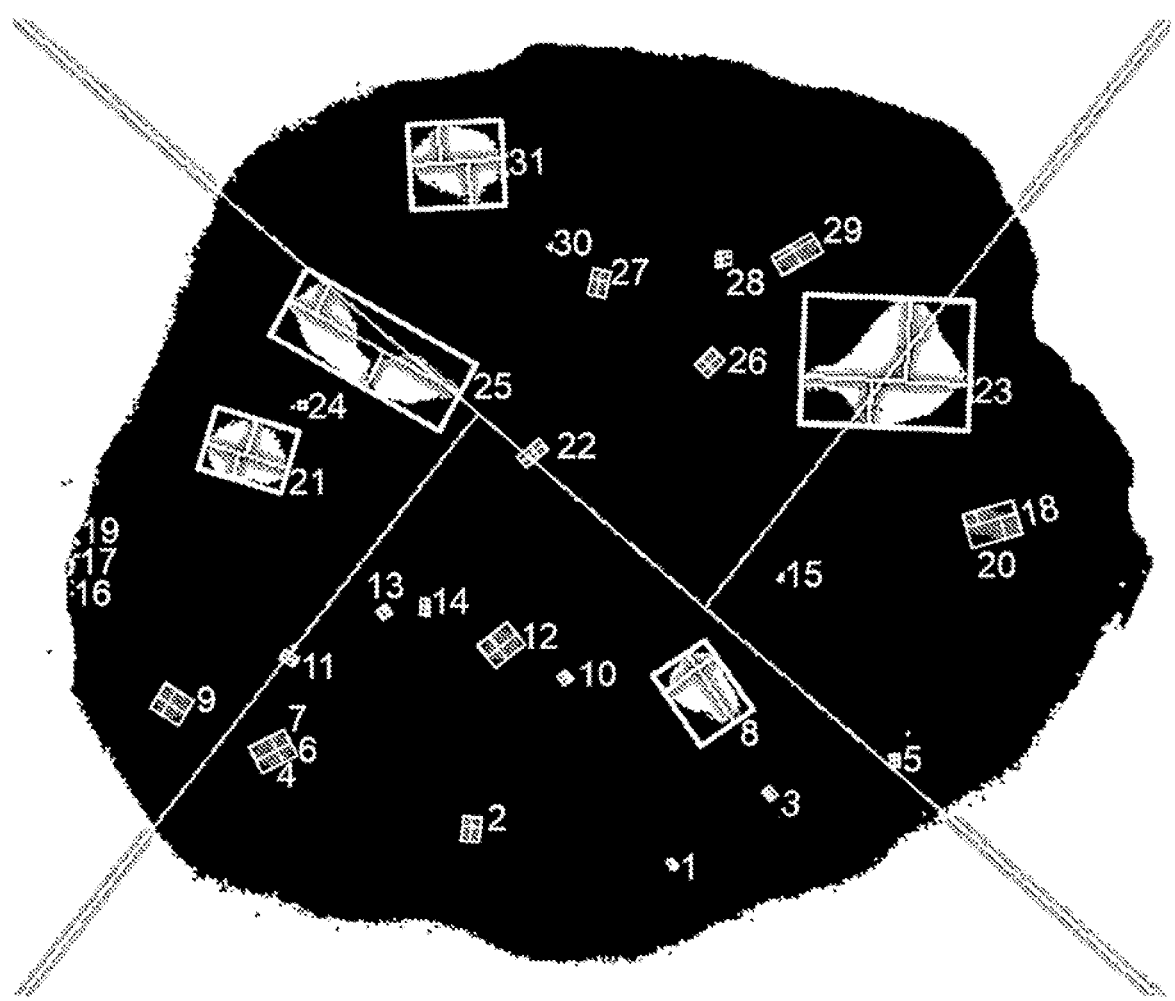
FIG. 3 is an electron microscope image for measuring the area of pores obtained by image processing of a cross-section of silver powder B2 prepared in Preparation Example 5 cut with an FIB.

In addition, FIG. 1 is an electron microscope image of a cross-section of the silver powder A3 prepared in Preparation Example 3 cut with a focused ion beam (FIB). FIGS. 2 and 3 are an electron microscope image of a cross-section of the silver powder B2 prepared in Preparation Example 5 cut with an FIB and one for measuring the area of pores obtained by image processing. In FIGS. 1 to 3, it was confirmed that the porosity of the silver powder B2 was larger than that of the silver powder A3.

Test Example 2: GC-MS and SDT

Pyrolysis gas chromatography mass spectrometry (pyrolysis GC-MS) for the organic substances coated on the surface of the silver powder was carried out by Pyrolyzer GC-MS of Agilent Technologies. In addition, simultaneous DSC and TGA (SDT) was carried out by SDT-Q600 of TA Korea at room temperature from 600° C. to 10° C./min.

The results are shown in Tables 1 and 2 below.

Figure 4:
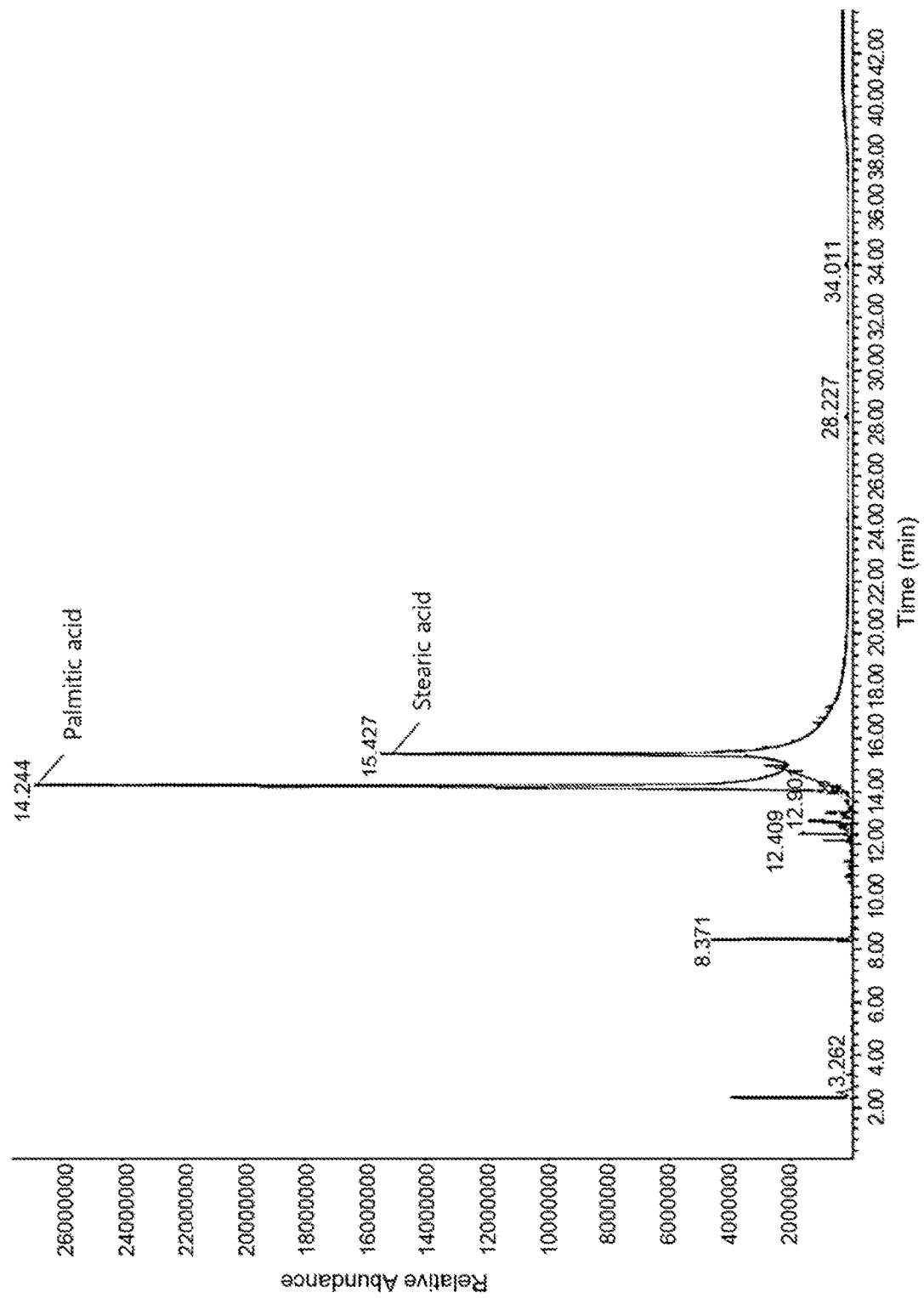
FIG. 4 shows the result of gas chromatography-mass spectrometry (GC-MS) of silver powder C2 prepared in Example 2.
Figure 5:
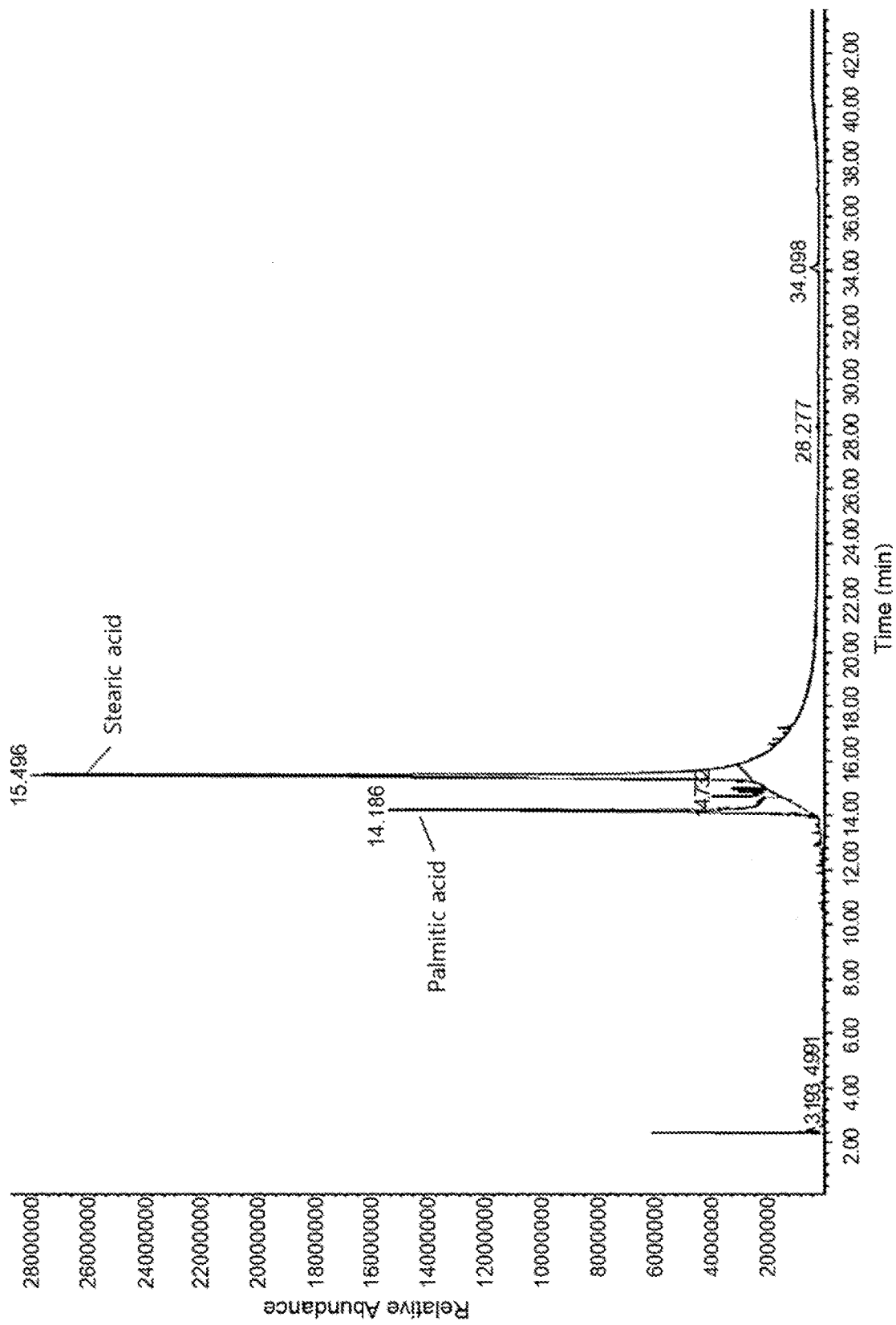
FIG. 5 shows the result of GC-MS of silver powder C5 prepared in Example 5.
Figure 6:
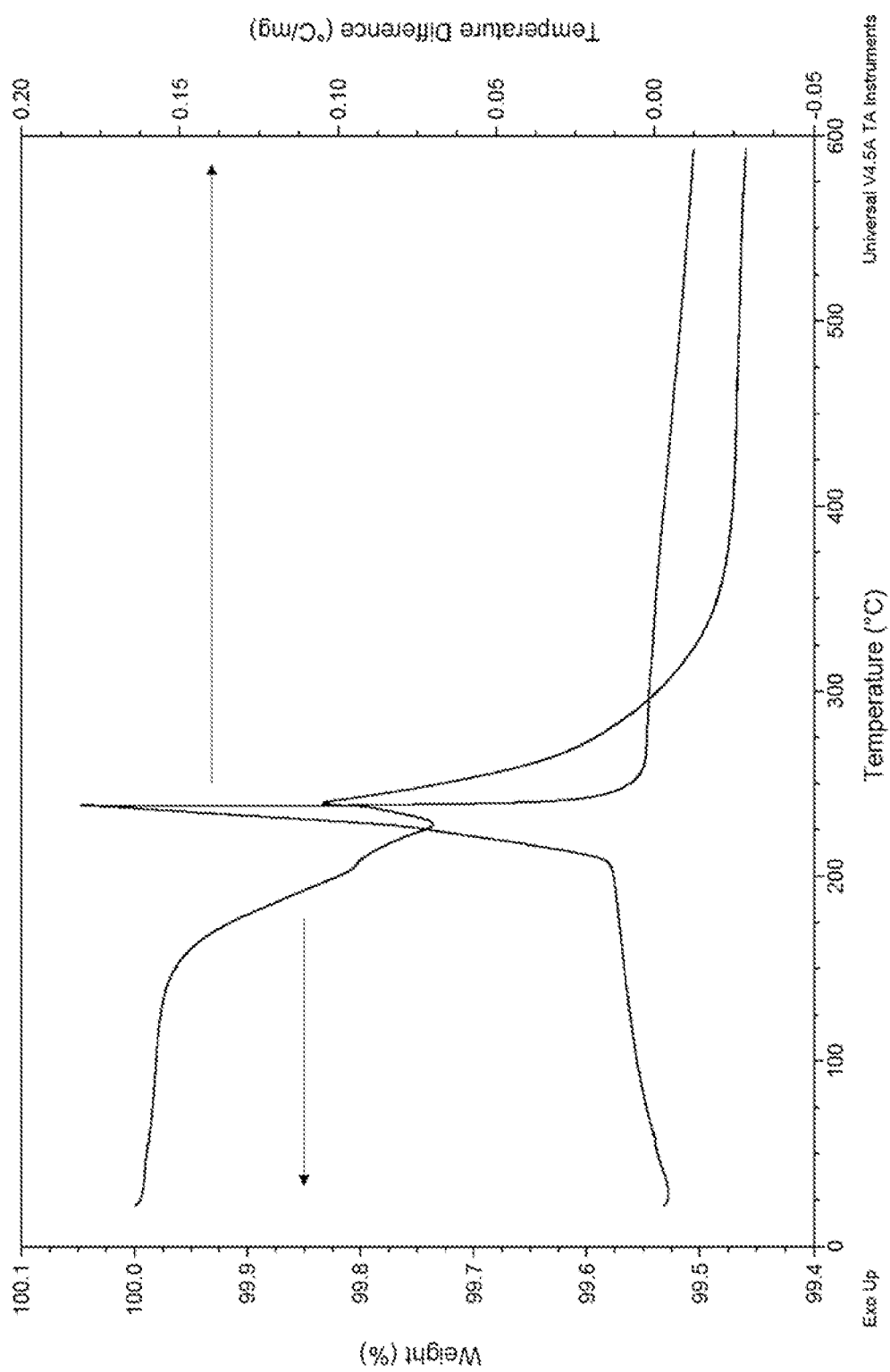
FIG. 6 shows the result of simultaneous DSC and TGA (SDT) of silver powder C5 prepared in Example 5.

In addition, FIG. 4 shows the result of GC-MS of the silver powder C2 prepared in Example 2. FIGS. 5 and 6 show the results of GC-MS and SDT of the silver powder C5 prepared in Example 5. In FIGS. 5 and 6, it was confirmed that two types of fatty acids were adsorbed on the surfaces of the silver powders. In addition, in FIG. 6, it was confirmed that the silver powders on which the two types of fatty acids had been adsorbed had a weight increase peak and an exothermic peak at a temperature of 200° C. to 300° C.

Test Example 3: Evaluation of Silver Powder 90 parts by weight of the silver powder, 2 parts by weight of PbO—TeO-based glass frit, and 8 parts by weight of an organic vehicle (including an EC-based binder resin, additives, and an organic solvent) were mixed and stirred by a planetary mixer and further dispersed using a 3-roll mill, followed by removing dust and impurities through filtration, to prepare a conductive paste.

The viscosity of the conductive paste was measured at 25° C. under the conditions of 10 rpm and 100 rpm using a Brookfield HB viscometer.

Thereafter, the conductive paste was screen printed on a P-type crystalline silicon wafer through a screen (3 bus bars and 158 finger patterns), dried, and sintered to prepare an electrode.

In order to evaluate the continuous printability at the time of preparing the electrode, EL disconnection was measured using K3300EPLI solar cell imaging test system equipment of Mcscience while the conductive paste was screen printed onto 1,000 wafers. As a result, the continuous printability was evaluated as "very good" when the EL disconnection observed was 1 or less, "good" when 2 or 3, "normal" when 4 or 5, and "poor" when 6 or more.

In addition, the resistance of the electrode was measured as the resistance of the finger electrode portion of the sintered wafer using a surface resistance meter of CMT-100S model of AIT.

In addition, the photovoltaic conversion efficiency (%) of a solar cell using the electrode was measured using CT-801 of Pasan.

The results are shown in Tables 1 and 2 below.

TABLE 1

| Item | | Ex. 1 | Ex. 2 | Ex. 3 | Ex. 4 | Ex. 5 | Ex. 6 |
|---|---|---|---|---|---|---|---|
| Silver powder | | C1 | C2 | C3 | C4 | C5 | C6 |
| Mixing ratio (part by weight) | Silver powder A | 80 | 50 | 66 | 80 | 50 | 66 |
| | Silver powder B | 20 | 50 | 34 | 20 | 50 | 34 |
| $D_{SEM}$ | | 1.18 | 1.27 | 1.37 | 1.48 | 1.25 | 1.33 |
| $D_{10}$ | | 0.491 | 0.758 | 0.744 | 0.977 | 0.602 | 0.749 |
| $D_{50}$ | | 1.216 | 1.613 | 1.542 | 1.652 | 1.278 | 1.488 |
| $D_{90}$ | | 2.475 | 2.632 | 2.477 | 2.732 | 2.226 | 2.391 |
| $D_{50}/D_{SEM}$ | | 1.03 | 1.27 | 1.13 | 1.12 | 1.02 | 1.12 |
| $[D_{90} - D_{10}]/D_{50}$ | | 1.63 | 1.16 | 1.12 | 1.06 | 1.27 | 1.10 |
| Specific surface area (BET, $m^2/g$) | | 0.501 | 0.322 | 0.366 | 0.415 | 0.418 | 0.374 |
| True specific gravity | | 10.08 | 9.90 | 9.78 | 10.08 | 9.9 | 9.78 |
| Tap density (TD, g/cc) | | 4.35 | 4.43 | 4.95 | 5.23 | 4.7 | 4.68 |
| Fatty acid (part by weight) | C16 fatty acid | 30 | 70 | 50 | 50 | 30 | 30 |
| | C18 fatty acid | 70 | 30 | 50 | 50 | 70 | 70 |
| Coated amount of fatty acid (wt. %) | | 0.15 | 0.3 | 0.5 | 0.15 | 0.3 | 0.5 |
| Viscosity (100 rpm, kcPs) | | 50 | 51 | 60 | 48 | 53 | 58 |
| Ratio of viscosities (10 rpm/100 rpm) | | 4.26 | 3.95 | 3.33 | 4.69 | 4.16 | 3.53 |
| Continuous printability | | Good | Very good | Very good | Very good | Very good | Good |
| Electrode resistance (mΩ, finger portion) | | 50.61 | 51.62 | 57.07 | 53.89 | 49.71 | 56.97 |
| Photovoltaic conversion efficiency of solar cell (%) | | 18.329 | 18.445 | 18.399 | 18.386 | 18.591 | 18.412 |

TABLE 2

| Item | | C. Ex. 1 | C. Ex. 2 | C. Ex. 3 | C. Ex. 4 | C. Ex. 5 |
|---|---|---|---|---|---|---|
| Silver powder | | D | E | F | G | H |
| Mixing ratio (part by weight) | Silver powder A | 100 | 0 | 50 | 80 | 80 |
| | Silver powder B | 0 | 100 | 50 | 20 | 20 |
| $D_{SEM}$ | | 1.51 | 1.34 | 1.24 | 1.21 | 1.51 |
| $D_{10}$ | | 1.002 | 0.875 | 0.631 | 0.523 | 0.991 |
| $D_{50}$ | | 1.576 | 1.956 | 1.368 | 1.299 | 1.699 |
| $D_{90}$ | | 2.562 | 3.413 | 2.524 | 2.681 | 3.001 |
| $D_{50}/D_{SEM}$ | | 1.04 | 1.46 | 1.10 | 1.07 | 1.13 |
| $[D_{90} - D_{10}]/D_{50}$ | | 0.99 | 1.30 | 1.38 | 1.66 | 1.18 |
| Specific surface area (BET, $m^2/g$) | | 0.428 | 0.361 | 0.452 | 0.487 | 0.304 |
| True specific gravity | | 10.2 | 9.6 | 9.9 | 10.08 | 10.08 |
| Tap density (TD, g/cc) | | 6.18 | 4.59 | 4.01 | 4.67 | 4.78 |
| Fatty acid (part by weight) | C16 fatty acid | 30 | 70 | 0 | 100 | 0 |
| | C18 fatty acid | 70 | 30 | 0 | 0 | 100 |
| Coated amount of fatty acid (wt. %) | | 0.15 | 0.15 | 0 | 0.3 | 0.3 |
| Viscosity (100 rpm, kcPs) | | 42 | 63 | — | 51 | 46 |
| Ratio of viscosities (10 rpm/100 rpm) | | 4.53 | 2.71 | — | 4.04 | 3.93 |
| Continuous printability | | Normal | Poor | — | Normal | Poor |
| Electrode resistance (mΩ, finger portion) | | 49.66 | 58.66 | — | 54.26 | 53.14 |
| Photovoltaic conversion efficiency of solar cell (%) | | 18.154 | 18.338 | — | 18.212 | 18.115 |

As shown in Tables 1 and 2 above, two types of spherical silver powders having different characteristics were mixed and two surface treatment agents were coated on the surfaces in Examples 1 to 6, so that the viscosity, viscosity ratio, continuous printability, and electrode resistance of the conductive paste and the photovoltaic conversion efficiency of the solar cell were excellent.

In contrast, only one type of silver powder was used in Comparative Examples 1 and 2, and only one type of a surface treatment agent was absorbed in Comparative Examples 4 and 5. As a result, at least one of the viscosity, viscosity ratio, continuous printability, and electrode resistance of the conductive paste and the photovoltaic conversion efficiency of the solar cell was poor.

Meanwhile, a surface treatment agent was not absorbed onto the silver powder in Comparative Example 3. As a result, the silver powder was not dispersed in the organic vehicle and was not coated to the wafer during screen printing, so that the evaluation could not be made.

The invention claimed is:

1. A mixed powder comprising two or more silver powders,
   wherein the two or more silver powders comprise two or more surface treatment agents on their surfaces, and
   wherein the cumulative 50% particle size by volume in particle size distribution, measured by laser diffraction particle size distribution measurement method, is 0.5 to 2.5 microns, and
   wherein the mixed powder has a weight increase peak at a temperature of 200° C. to 300° C. in thermogravimetric analysis (TGA) under an elevated temperature condition of 10° C./min.

2. A conductive paste comprising the mixed powder of claim 1.

* * * * *